United States Patent
Goetz et al.

(10) Patent No.: US 6,621,379 B1
(45) Date of Patent: *Sep. 16, 2003

(54) HERMETIC PACKAGE FOR SURFACE ACOUSTIC WAVE DEVICE AND METHOD OF MANUFACTURING THE SAME

(75) Inventors: Martin P. Goetz, Dallas, TX (US); Merrill A. Hatcher, Garland, TX (US); Christopher E. Jones, Arlington, TX (US)

(73) Assignee: Clarisay, Incorporated, Dallas, TX (US)

(*) Notice: Subject to any disclaimer, the term of this patent is extended or adjusted under 35 U.S.C. 154(b) by 42 days.

This patent is subject to a terminal disclaimer.

(21) Appl. No.: 09/997,971

(22) Filed: Nov. 29, 2001

(51) Int. Cl.[7] ............... H03H 9/64; H03H 3/007; H03H 3/08; H03H 9/10
(52) U.S. Cl. ............ 333/193; 310/348; 310/313 R; 29/25.35
(58) Field of Search ............... 333/193–196, 333/348; 310/313 R, 313 B, 313 C, 313 D; 257/415, 678; 29/25.35; 438/110, 51; 174/52, 3

(56) References Cited

U.S. PATENT DOCUMENTS

| | | | | |
|---|---|---|---|---|
| 4,734,608 A | * | 3/1988 | Takoshima | 310/313 R |
| 4,920,801 A | | 5/1990 | Church | 73/517 R |
| 5,235,135 A | | 8/1993 | Knecht et al. | 174/52.3 |
| 5,345,134 A | | 9/1994 | Greer | 310/313 D |
| 5,453,652 A | * | 9/1995 | Eda et al. | 310/313 R |
| 5,594,979 A | * | 1/1997 | Borchelt et al. | 29/25.35 |
| 5,699,027 A | | 12/1997 | Tsuji et al. | 333/193 |
| 5,896,636 A | | 4/1999 | Penunuri | 29/25.35 |
| 5,917,265 A | | 6/1999 | Naumenko et al. | 310/313 A |
| 5,952,765 A | | 9/1999 | Garber et al. | 310/313 B |
| 6,114,635 A | | 9/2000 | Lakin et al. | 174/260 |
| 6,154,940 A | * | 12/2000 | Onishi et al. | 29/25.35 |
| 6,181,015 B1 | | 1/2001 | Gotoh | 257/778 |
| 6,225,692 B1 | | 5/2001 | Hinds | 257/698 |
| 6,262,513 B1 | | 7/2001 | Furukawa et al. | 310/313 R |
| 6,321,444 B1 | | 11/2001 | Yatsuda et al. | 29/832 |
| 6,445,265 B1 | * | 9/2002 | Wright | 333/193 |
| 6,498,422 B1 | * | 12/2002 | Hori | 310/344 |
| 6,507,097 B1 | * | 1/2003 | Goetz et al. | 257/678 |

FOREIGN PATENT DOCUMENTS

| | | | |
|---|---|---|---|
| EP | 1 058 306 | * | 12/2000 |
| JP | 8-18390 | * | 1/1996 |
| JP | 8-32402 | | 2/1996 |
| JP | 8-330894 | * | 12/1996 |

OTHER PUBLICATIONS

"Feasibility of Surface Activated Bonding for Ultra–fine Pitch Interconnection—a New Concept of Bump–less Direct Bonding for System Level Packaging" by T. Suga; 4 pages; 2000 IEEE Electronics Components and Technology Conference.

(List continued on next page.)

Primary Examiner—Barbara Summons

(57) ABSTRACT

The present invention provides a surface acoustic wave (SAW) circuit package including: (1) a substantially planar piezoelectric substrate having an active surface, (2) an electronic circuit located over the active surface, (3) an encapsulant substrate having a bonding surface and (4) a bonding material interposing and creating a hermetic seal between the active surface and the bonding surface and around a void between the piezoelectric substrate and the encapsulant substrate. In one embodiment, the void has lateral dimensions at least equaling a footprint of the electronic circuit.

29 Claims, 4 Drawing Sheets

OTHER PUBLICATIONS

"A Novel Temperature Compensation Method for SAW Devices Using Direct Bonding Techniques" by K. Onishi, A. Namba, H. Sato, T. Ogura, S. Seki, Y. Taguchi, Y. Tomita, O. Kawasaki and K. Eda; pp. 227–230; 1997 IEEE Ultrasonics Symposium.

"Silicon Wafer Bonding for MEMS Manufacturing" by A. A. Ayon; Solid State Technology Publication; Aug. 1999; vol. 42, Issue 8; 6 pages.

"Direct Bonding of Piezoelectric Materials Onto Si" by Kazuo Eda, Yoshihiro Tomita, Masato Sugimoto, Tetsuyoshi Ogura, Akihiko Nanba, Yutaka Taguchi and Osamu Kawasaki; pp. 719–722, vol. 2 of the 1996 IEEE Proceeding of the Tenth IEEE International Symposium; Aug., 1996.

"Si/Si Interface Bonded at Room Temperature by Ar Beam Surface Activation" by H. Takagi, R. Maeda, N. Hosoda and T. Suga; 1999; pp. 341–344; Published in "Intergranular and Interphase Boundaries in Materials", Materials Science Forum, vols. 294–296.

"Even–Order Thickness–Shear Mode Resonators Using X–Cut Lita03 Plates Realized by a Direct Bonding Technique" by M. Sugimoto, K. Takeda, T. Ohtsuchi, Y. Tomita and O. Kawasaki; pp. 919–923; 1998 IEEE Ultrasonics Symposium.

* cited by examiner

HERMETIC PACKAGE FOR SURFACE ACOUSTIC WAVE DEVICE AND METHOD OF MANUFACTURING THE SAME

TECHNICAL FIELD OF THE INVENTION

The present invention is directed, in general, to surface acoustic wave circuits and, more specifically, to a hermetic package for a surface acoustic wave circuit and method of manufacturing such hermetic package therefor.

BACKGROUND OF THE INVENTION

Piezoelectric devices for use in electronic signal processing, especially surface acoustic wave (SAW) devices, have been advantageously adopted by the electronics industry. Such SAW devices have several advantages over more conventional technologies. For instance, they can be designed to provide complex signal processing in a single unit, and they also offer an additional benefit from their ability to be mass produced using semiconductor microfabrication techniques. These techniques lead to lower-cost devices having only small operating characteristic variations from unit to unit. Since SAW devices may be implemented in rugged, light-weight and power-efficient modules, they find many important applications, especially in mobile, wireless and spaceborne communication systems. Such communication systems typically operate over a wide range of frequencies from about 10 megahertz to about two gigahertz. The specific signal processing capabilities and frequency range of SAW devices may be determined to allow SAW devices to perform several roles in electronic systems.

An important feature of the SAW device is its geometry, which incorporates two metal patterns having interdigitated conductive lines or traces. Such interdigitated metal structures are formed on a piezoelectric substrate and act as input and output signal paths when an AC signal voltage is applied to one of the metal structures. This AC voltage induces a surface acoustic wave in the underlying substrate wherein the acoustic wave propagates to the output structure. The interdigitated metal lines of the signal receiving portion detect the acoustic wave and convert it into a filtered electrical output signal. SAW devices, operating in the Rayleigh wave mode, can generally be designed to provide bandpass filters that achieve responses that would otherwise require several hundred inductors and capacitors in conventional LC filter designs.

Proper operation and containment of the acoustic waves require precise construction. Existing surface acoustic wave device packaging has become well accepted in response to such requirements. Additionally, accurate and reliable performance of surface acoustic wave devices requires hermetic protection of the active surfaces of the devices. However, existing packaging practices often fail to fully and economically passivate the surface acoustic wave device active surface, thereby permitting particulate or contaminants to interfere with the active surface and render the performance of the SAW device inaccurate and unreliable. Such contamination concerns also exist with regard to other contact-sensitive electronic components, including other piezoelectric, pyroelectric and micro-electromechanical (MEMS) applications.

Accordingly, what is needed in the art is a hermetic package for surface acoustic wave devices and other contact-sensitive electronic components, as well as a method of manufacturing such a hermetic package.

SUMMARY OF THE INVENTION

To address the above-discussed deficiencies of the prior art, the present invention provides a SAW circuit package including: (1) a substantially planar piezoelectric substrate having an active surface, (2) an electronic circuit located over the active surface, (3) an encapsulant substrate having a bonding surface and (4) a bonding material interposing and creating a hermetic seal between the active surface and the bonding surface and around a void between the piezoelectric substrate and the encapsulant substrate. In one embodiment, the void has lateral dimensions at least equaling a footprint of the electronic circuit.

In one embodiment of the invention, the package further includes a passivation layer over the encapsulant substrate and spanning the encapsulant substrate and piezoelectric substrate. The passivation layer, while optional, may be desirable in certain applications.

In one embodiment of the invention, the encapsulant substrate comprises one selected from the group consisting of: (1) ceramic, (2) silicon and (3) glass.

In one embodiment of the invention, the piezoelectric substrate comprises one selected from the group consisting of: (1) bismuth germanium oxide, (2) gallium arsenide, (3) lithium borate, (4) lithium niobate, (5) langasite, (6) lithium tantalate, (7) lead zirconium tantalate (8) and quartz.

In one embodiment of the invention, the package further includes a plurality of vias containing metal, the metal contacting the electronic circuit to form terminals therefor. Those skilled in the pertinent art will recognize how such vias may be formed in the encapsulant substrate or, alternatively, in a passivation layer and/or the bonding material.

In one embodiment of the invention, the piezoelectric substrate and the encapsulant substrate have substantially coextensive footprints. Alternatively, the piezoelectric substrate may encompass the footprints of multiple encapsulant substrates.

In one embodiment of the invention, the electronic circuit comprises SAW circuit conductors that cooperate to form multiple SAW resonators. Those skilled in the pertinent art will recognize, however, that other applications may benefit from the architecture described herein, including hermetic wafer-scale and chip-scale packages for unpassivated piezoelectric, pyroelectric and MEMS devices.

In one embodiment of the invention, the void comprises a recess located on the bonding surface and/or the active surface.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
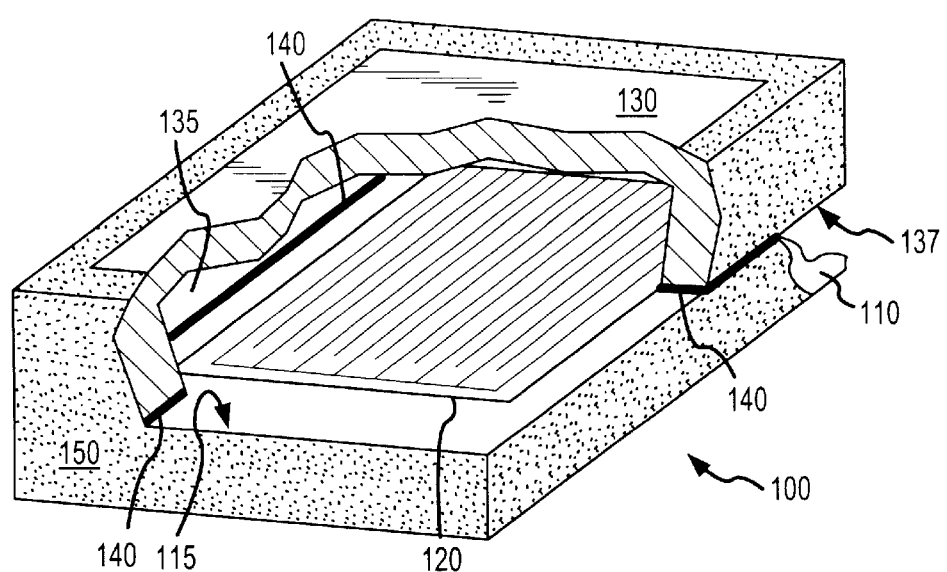
FIG. 1 illustrates a hermetic package for a surface acoustic wave device constructed according to the principles of the present invention, the illustration depicting a portion of a passivation layer 150, an encapsulant substrate 130 and a piezoelectric substrate 110 removed for clarity.

Referring initially to FIG. 1, illustrated is a surface acoustic wave device hermetic package 100. The package 100 includes a piezoelectric substrate 110 having an active surface 115, an encapsulant substrate 130 having a bonding surface 137, and an electronic circuit 120 formed in or on, or secured to the active surface 115. The package 100 further includes a bonding material 140 interposed and creating a hermetic seal between the active surface 115 and the bonding surface 137 and around a void 135 between the piezoelectric substrate and the encapsulant substrate such that particulate and contaminants are precluded from contacting the electronic circuit 120. The package 100 is illustrated in FIG. 1 with a portion of the encapsulant substrate 130 and the piezoelectric substrate 110 removed for clarity. In the illustrated embodiment, the encapsulant substrate 130 may comprise ceramic, silicon or glass. The piezoelectric substrate 110 may comprise bismuth germanium oxide, gallium arsenide, lithium borate, lithium niobate, lithium tantalate, langasite, lead zirconium tantalate or quartz. The various materials that may advantageously be used for bonding material 140 should be well understood to those skilled in the art.

In the illustrated embodiment, the void 135 is at least partially formed by a recess located on the bonding surface 137 of the encapsulant substrate 130, the void 135 preferably having lateral dimensions at least equal to a footprint of the electronic circuit 120. The lateral dimensions of the void 135 are intended to include the length and width of the void 135, but not the depth of the void 135. Those skilled in the art should understand that the void 135 may also be at least partially formed by a similar recess (not shown) located on the active surface 115 of the piezoelectric substrate 110 and preferably having lateral dimensions at least equal to a footprint of the electronic circuit 120. In one embodiment, the void 135 may be formed by recesses in both the active surface 115 and the bonding surface 137.

In the illustrated embodiment, the void 135 may be evacuated, such that the void 135 contains a vacuum. By evacuating the void and subsequently sealing the void by means of the hermetic seal created by the bonding material 140, operation of the electronic circuit 120 will not be disturbed or otherwise influenced by unwanted solids, liquids, particulate or other contaminants. In this manner, an unpassivated and contact-sensitive electronic circuit 120 may nonetheless be protected to ensure predictable performance. However, those skilled in art understand that such protection may also be afforded by bonding the active surface 115 and the bonding surface 137 within an inert atmosphere such as nitrogen, in lieu of evacuating the void prior to bonding.

The hermetic package 100 may also include a passivation layer 150 covering all or a portion of the encapsulant substrate 130, the piezoelectric substrate 110 and/or the bonding material 140. The passivation layer 150 is primarily employed to resolve any mechanical or handling issues that may arise. By protecting the package 100 with the passivation layer 150, the threat of damage encountered in subsequent manual or automated handling and assembly procedures (e.g., pick-and-place procedures) may be mitigated. The passivation layer 150 may comprise a standard encapsulant epoxy resin conventionally used and known to those skilled in the art. The passivation layer 150 may be applied to the package 100 either by injection, transfer molding or liquid disposition. The passivation layer 150 is indicated in FIG. 1 as a shaded area covering the perimeter of the top surface of the encapsulant substrate 130 and spanning the encapsulant substrate 130 and piezoelectric substrate 110 around the perimeter of the package 100. A portion of the passivation layer 150 has been removed for clarity in FIG. 1.

The hermetic package 100 may also include a plurality of vias or trenches (not shown) containing metal. The vias or trenches or the metal therein may contact the electronic circuit 120 and extend to the exterior of the package 100, thereby creating terminals for the package 100. It should be familiar to those skilled in the art how such vias or trenches may be formed in the package 100, such as being formed in the encapsulant substrate 130, the piezoelectric substrate 110, the passivation layer 150 and/or the bonding material 140.

In the preferred embodiment illustrated in FIG. 1, the encapsulant substrate 130 may have a footprint substantially coextensive with the footprint of the piezoelectric substrate 110. However, those skilled in the art should recognize that differences between the footprints of the encapsulant substrate 130 and the piezoelectric substrate 110 are within the scope of the present invention. For instance, the piezoelectric substrate 110 may encompass the footprints of multiple encapsulant substrates 130.

In the illustrated embodiment, the electronic circuit 120 may comprise SAW conductors. Such SAW conductors may cooperate to form multiple SAW resonators or other typical SAW circuits. Those skilled in the art should recognize that the electronic circuit 120 is not limited by the scope of the present invention to SAW applications, and that the architecture of the package 100 is equally beneficial to applications calling for other piezoelectric, pyroelectric, MEMS or mirror devices that would benefit from the hermetic passivation ensured by this architecture.

Figure 2:
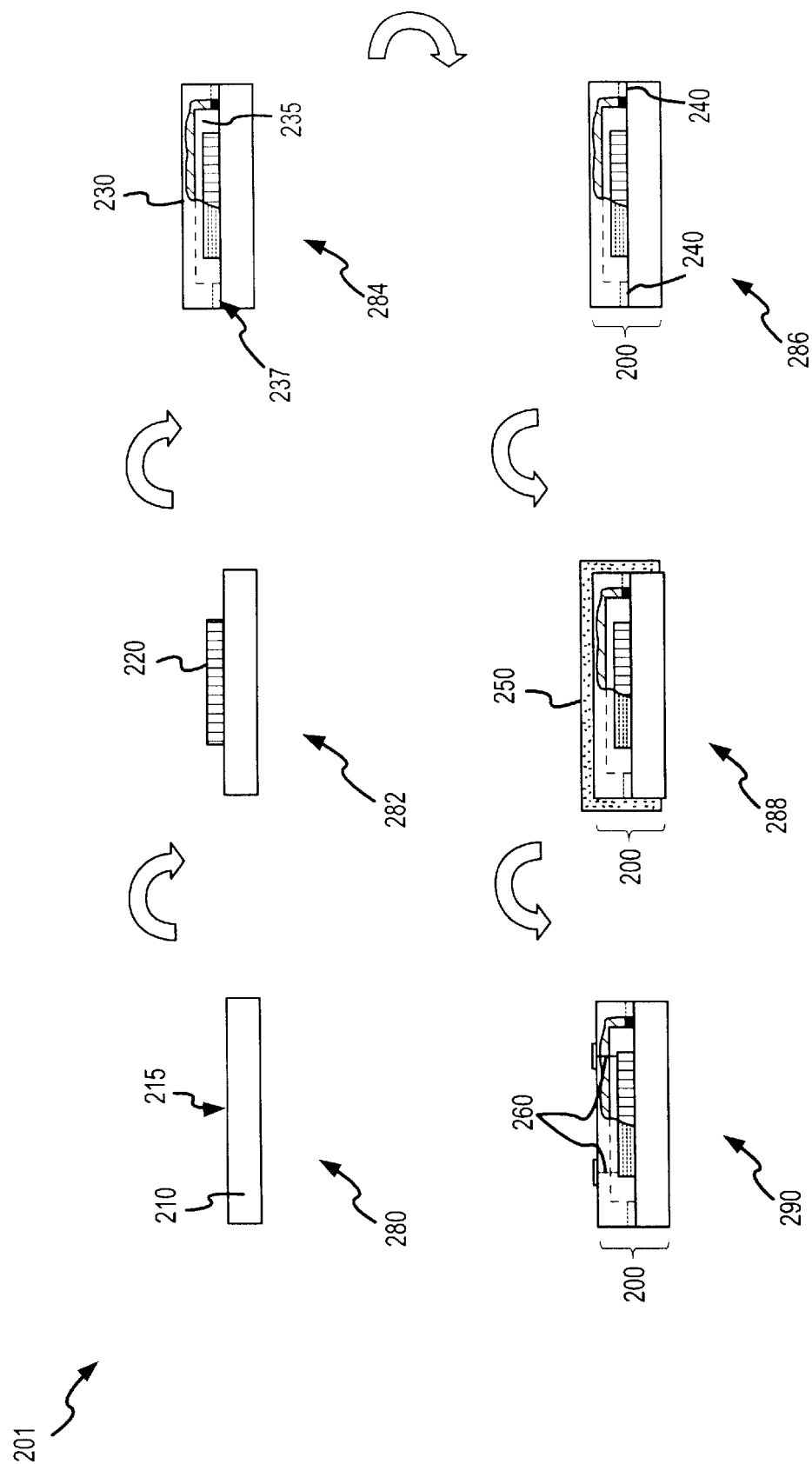
FIG. 2 illustrates a method of manufacturing an embodiment of a hermetic package for a surface acoustic wave device, which in the present embodiment may be similar to the hermetic package illustrated in FIG. 1.

Turning now to FIG. 2, illustrated is a method 201 of manufacturing an embodiment of a surface acoustic wave hermetic package 200, which in the present embodiment may be similar to the package 100 illustrated in FIG. 1. The method 201 begins at a step 280, wherein a substantially planar piezoelectric substrate 210 is provided. The piezoelectric substrate 210 includes an active surface 215, and may comprise bismuth germanium oxide, gallium arsenide, lithium borate, lithium niobate, lithium tantalate, langasite, lead zirconium tantalate or quartz.

In a step 282, an electronic circuit 220 is formed in or on, or secured to the active surface 215. In one embodiment, the electronic circuit 220 may comprise SAW conductors. Such SAW conductors may cooperate to form multiple SAW resonators or other typical SAW circuits. Those skilled in the art should recognize that the electronic circuit 220 is not limited by the scope of the present invention to SAW applications, and that the architecture of the package 200 and the method 201 are equally beneficial to applications calling for other piezoelectric, pyroelectric, MEMS or mirror devices that would benefit from the hermetic passivation ensured by this architecture.

In a step 284, an encapsulant substrate 230 having a bonding surface 237 is positioned over the piezoelectric substrate 210. In the illustrated embodiment, the encapsulant substrate 230 includes a recess 235 on its bonding surface 237, and may comprise ceramic or silicon. The recess 235 preferably has lateral dimensions at least equal to a footprint of the electronic circuit 220. The lateral dimensions of the recess 235 are intended to include the length and width of the recess 235, but not the depth of the recess 235.

The encapsulant substrate 230 may further have a footprint substantially coextensive with a footprint of the piezoelectric substrate 210. However, those skilled in the art will understand that while the illustrated embodiment includes substantially coextensive footprints of the substrates 230, 210, nonconforming footprints are within the scope of this invention. For instance, the piezoelectric substrate 210 may encompass the footprints of multiple encapsulant substrates 230.

In a step 286, which may complete the method 201, a bonding material 240 is arranged interposing the active surface 215 and the bonding surface 237 and around a void between the piezoelectric substrate and the encapsulant substrate created by the recess 235. In this manner, bonding material 240 creates a hermetic seal between the active surface 215 and the bonding surface 237. The various materials that may advantageously be used for bonding material 140 should be well understood to those skilled in the art. Those skilled in the art should also understand that the void may further or alternatively comprise a recess in the piezoelectric substrate 210.

In the illustrated embodiment, the void formed by the recess 235 and the active surface 215 is preferably evacuated, such that the void contains a vacuum. By evacuating the void and subsequently sealing the void by means of the hermetic seal created A by the bonding material 240, operation of the electronic circuit 220 will not be disturbed or otherwise influenced by unwanted solids, liquids, particulate or other contaminants. In this manner, an unpassivated and contact-sensitive electronic circuit 220 may nonetheless be protected to ensure predictable performance. However, those skilled in art understand that such protection may also be afforded by bonding the active surface 215 and the bonding surface 237 within an inert atmosphere such as nitrogen, in lieu of evacuating the gap prior to bonding.

In another embodiment, the method 201 may further comprise a step 288, wherein a passivation layer 250 is formed over at least a portion of the encapsulant substrate 230, thereby spanning the encapsulant substrate 230 and the piezoelectric substrate 210. The passivation layer 250 is primarily employed to resolve any mechanical or handling issues that may arise. By protecting the package 200 with the passivation layer 250, the threat of damage encountered in subsequent manual or automated handling and assembly procedures (e.g., pick-and-place procedures) may be mitigated. The passivation layer 250 may comprise a standard encapsulant epoxy resin conventionally used and known to those skilled in the art. The passivation layer 250 may be applied to the package 200 either by injection, transfer molding or liquid disposition.

In another embodiment, the method 201 may further comprise a step 290, wherein a plurality of vias 260 containing metal are formed in the package 200 by conventional practices understood by those skilled in the art. The vias 260 or the metal therein may contact the electronic circuit 220 and extend to the exterior of the package 200, thereby creating terminals for the package 200. It should be understood by those skilled in the art that the vias 260 may be formed in or on the surface of the encapsulant substrate 230, the piezoelectric substrate 210, the passivation layer 250 and/or the bonding material 240. It should also be understood by those skilled in the art that the plurality of vias 260 may comprise one or more trenches formed along a surface of the package 200.

Figure 3:
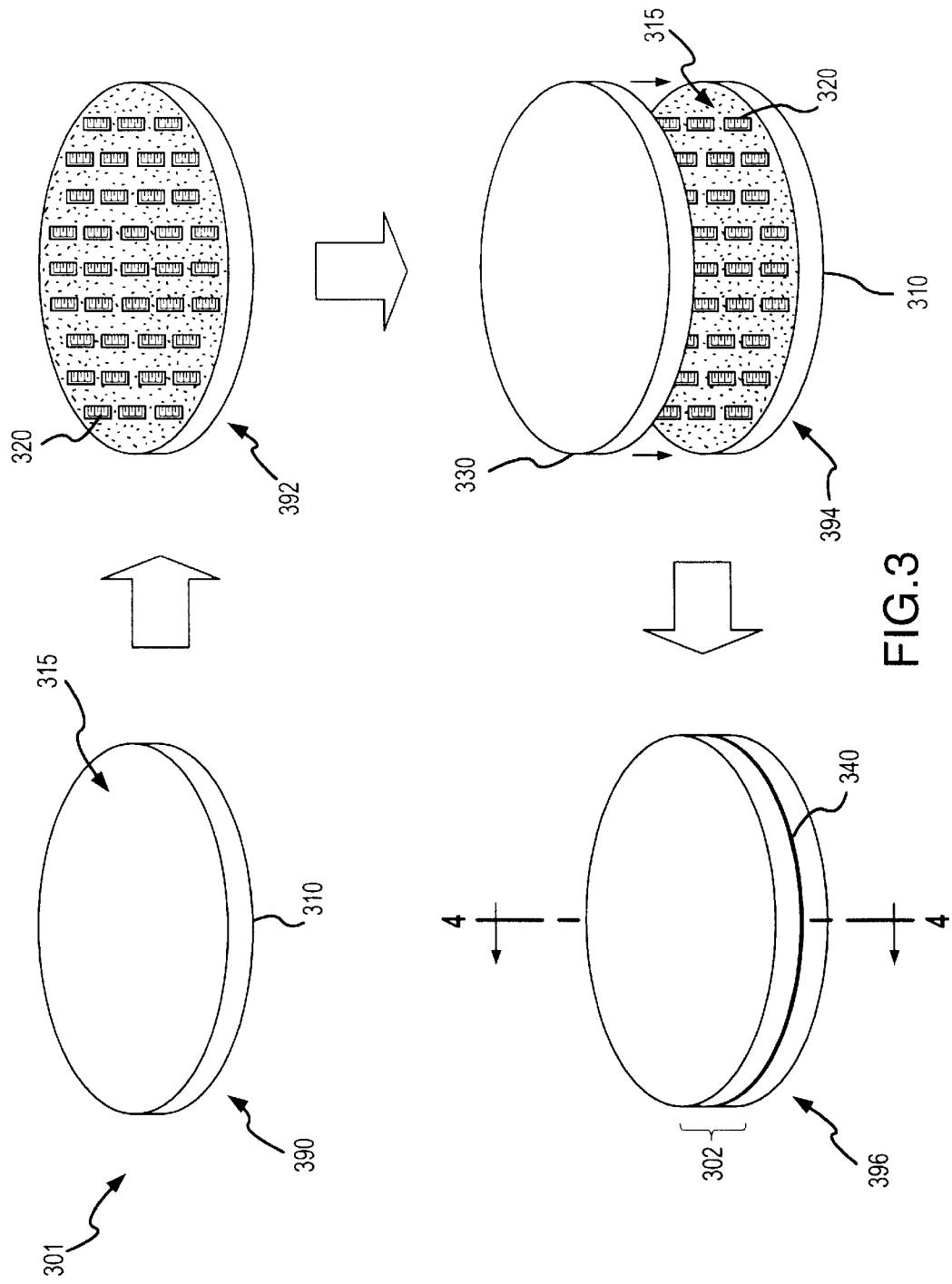
FIG. 3 illustrates a method of manufacturing an embodiment of a wafer-scale hermetic package for surface acoustic wave devices according to the principles of the present invention.

Turning to FIG. 3, illustrated is a method 301 of manufacturing a wafer-scale SAW package 300. The method 301 begins at a step 390, wherein a substantially planar piezoelectric substrate 310 is provided in a wafer form familiar to those skilled in the art. The piezoelectric substrate 310 includes an active surface 315 and may comprise bismuth germanium oxide, gallium arsenide, lithium borate, lithium niobate, lithium tantalate, langasite, lead zirconium tantalate or quartz.

A next step 392 includes a plurality of electronic circuits 320 formed in or on, or secured to the active surface 315. In one embodiment, each of the plurality of electronic circuits 320 may comprise SAW conductors. Such SAW conductors may cooperate to form multiple SAW resonators or other typical SAW circuits. Those skilled in the art should recognize that the type of each of the plurality of electronic circuits 320 is not limited by the scope of the present invention to SAW applications, and that the architecture of the package 300 is equally beneficial to applications calling for other piezoelectric, pyroelectric, MEMS or mirror devices that would benefit from the hermetic passivation ensured by this architecture.

In a subsequent step 394, an encapsulant substrate 330 having a bonding surface (not shown) is positioned over the piezoelectric substrate 310. In the illustrated embodiment, the encapsulant substrate 330 may comprise ceramic, silicon or glass.

In a step 396, which may complete the method 301, a bonding material 340 is arranged interposing the active surface 315 and the bonding surface and around at least one of a plurality of voids (not shown) between the encapsulant substrate 330 and the piezoelectric substrate 310. In this manner, bonding material 340 creates a hermetic seal between the active surface 315 and the bonding surface. In one embodiment, the bonding material 340 may create a hermetic seal around each of the plurality of electric circuits 320. In an alternative embodiment, two or more of the plurality of electronic circuits 320 may be jointly sealed by a single hermetic seal formed by the bonding material 340, such that two or more interconnected electronic circuits 320 may be hermetically sealed as a discrete circuit (not shown). The various materials that may advantageously be used for bonding material 340 should be well understood to those skilled in the art.

Figure 4:
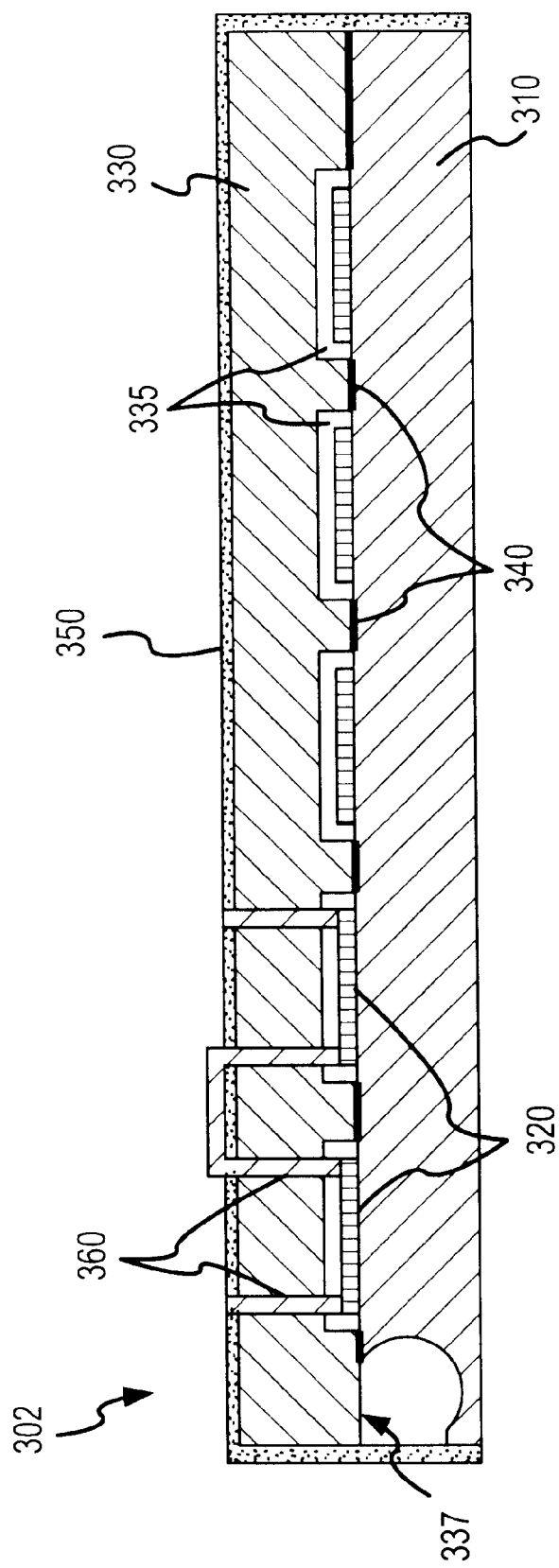
FIG. 4 illustrates a section view of the wafer-scale hermetic package for surface acoustic wave devices constructed according to the method illustrated in FIG. 3.

Turning to FIG. 4, illustrated is a section view of the package 300 described with reference to FIG. 3. In the illustrated embodiment, the plurality of voids includes a plurality of recesses 335 on the bonding surface 337 of the encapsulant substrate 330. Each of the plurality of recesses 335 preferably has lateral dimensions at least equal to a footprint of a corresponding one of the plurality of electronic circuits 320. The lateral dimensions of each of the plurality of recesses 335 are intended to include the length and width of an individual recess 335, but not the depth of an individual recess 335. Those skilled in the art should understand that the plurality of voids may further or alternatively include a plurality of recesses (not shown) in the piezoelectric substrate 310.

In one embodiment, one or more of the plurality of voids is evacuated, such that the voids contain a vacuum. By evacuating the voids and subsequently sealing the voids by means of the hermetic seal created by the bonding material 340, operation of each of the plurality of electronic circuits 320 will not be disturbed or otherwise influenced by unwanted solids, liquids, particulate or other contaminants. In this manner, a plurality of unpassivated and contact-sensitive electronic circuits 320 may nonetheless be protected to ensure predictable performance.

In another embodiment, the method 301 may further comprise an additional step wherein a passivation layer 350 is formed over at least a portion of the encapsulant substrate 330, thereby spanning the encapsulant substrate 330 and the piezoelectric substrate 310. The passivation layer 350 is primarily employed to resolve any mechanical or handling issues that may arise. By protecting the package 300 with the passivation layer 350, the threat of damage encountered in subsequent manual or automated handling and assembly procedures (e.g., pick-and-place procedures) may be mitigated. The passivation layer 350 may comprise standard encapsulant epoxy resin conventionally used and known to those skilled in the art. The passivation layer 350 may be applied to the package 300 either by injection, transfer molding or liquid disposition.

In another embodiment, the method 301 may further comprise an additional step wherein a plurality of vias 360 containing metal are formed in the package 300 by conventional practices understood by those skilled in the art. The vias 360 or the metal therein may contact one of the plurality of electronic circuits 320 and extend to the exterior of the package 300, thereby creating terminals for the package 300. It should be understood by those skilled in the art that the vias 360 may be formed in the encapsulant substrate 330, the piezoelectric substrate 310, the passivation layer 350 and/or the bonding material 340. Also, in an alternative embodiment, two or more of the plurality of electronic circuits 320 may be interconnected. One or more of the plurality of vias 360 may be employed to accomplish such interconnection, or, in the alternative, conventional methods of interconnection may be employed within the scope of this invention.

The manufacturing method 301 may also include a step (step not shown) in which the hermetic wafer assembly 302 may be separated into individual hermetic packages (packages not shown, but similar to the hermetic package 200 discussed in reference to FIG. 2), each package containing one or more electronic devices. In an exemplary embodiment, the hermetic wafer assembly 302 may be separated into the individual hermetic packages using wafer dicing, however, one skilled in the art understands that any compatible separation technique may be used.

Although the present invention has been described in detail, those skilled in the art should understand that they can make various changes, substitutions and alterations herein without departing from the spirit and scope of the invention in its broadest form.

What is claimed is:

1. An electronic circuit package, comprising:
   a substantially planar piezoelectric substrate having an active surface;
   an electronic circuit located over said active surface;
   an encapsulant substrate having a bonding surface;
   a bonding material interposing and creating a hermetic seal between said active surface and said bonding surface and around a void between said piezoelectric substrate and said encapsulant substrate, said void having lateral dimensions at least equaling a footprint of said electronic circuit; and
   a passivation layer over at least a portion of said encapsulant substrate and spanning said encapsulant substrate and said piezoelectric substrate.

2. The package as recited in claim 1 wherein said void comprises a recess located on said active surface.

3. The package as recited in claim 1 wherein said encapsulant substrate comprises one selected from the group consisting of:
   ceramic,
   silicon, and
   glass.

4. The package as recited in claim 1 wherein said piezoelectric substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

5. The package as recited in claim 1 further comprising a plurality of vias containing metal, said metal contacting said electronic circuit to form terminals therefor.

6. The package as recited in claim 1 wherein said piezoelectric substrate and said encapsulant substrate have substantially coextensive footprints.

7. The package as recited in claim 1 wherein said electronic circuit comprises surface acoustic wave (SAW) circuit conductors that cooperate to form multiple SAW resonators.

8. The package as recited in claim 1 wherein said electronic circuit comprises a device selected from the group consisting of:
   a surface acoustic wave device,
   a micro-electromechanical system device,
   a mirror device,
   a pyroelectric device, and
   a piezoelectric device.

9. The package as recited in claim 1 wherein said void comprises a recess located on said bonding surface.

10. A method of manufacturing an electronic circuit package, comprising:
    providing a substantially planar piezoelectric substrate having an active surface;
    forming an electronic circuit over said active surface;
    positioning an encapsulant substrate over said piezoelectric substrate, said encapsulant substrate having a bonding surface;
    arranging a bonding material interposing and creating a hermetic seal between said active surface and said bonding surface and around a void between said piezoelectric substrate and said encapsulant substrate, said void having lateral dimensions at least equaling a footprint of said electronic circuit; and forming a passivation layer over at least a portion of said encapsulant substrate and spanning said encapsulant substrate and said piezoelectric substrate.

11. The method as recited in claim 10 wherein said void comprises a recess located on said bonding surface.

12. The method as recited in claim 10 wherein said void comprises a recess located on said active surface.

13. The method as recited in claim 10 wherein said positioning further comprises positioning an encapsulant substrate comprising one selected from the group consisting of:

ceramic, silicon, and glass.

14. The method as recited in claim 10 wherein said providing further comprises providing a piezoelectric substrate comprising one selected from the group consisting of:

bismuth germanium oxide, gallium arsenide, lithium borate, lithium niobate, lithium tantalate, langasite, lead zirconium tantalate, and quartz.

15. The method as recited in claim 10 further comprising forming a plurality of vias containing metal, said metal contacting said electronic circuit to form terminals therefor.

16. The method as recited in claim 10 wherein said positioning further comprises positioning an encapsulant substrate having a footprint substantially coextensive with a footprint of said piezoelectric substrate.

17. The method as recited in claim 10 wherein said forming further comprises forming an electronic circuit comprising surface acoustic wave (SAW) circuit conductors that cooperate to form multiple SAW resonators.

18. The method as recited in claim 10 wherein said electronic circuit comprises a device selected from the group consisting of:

a surface acoustic wave device, a micro-electromechanical system device, a mirror device, a pyroelectric device, and a piezoelectric device.

19. A method of manufacturing a wafer-scale electronic circuit package, comprising:

providing a substantially planar piezoelectric substrate having an active surface;

forming a plurality of electronic circuits over said active surface;

positioning an encapsulant substrate over said piezoelectric substrate, said encapsulant substrate having a bonding surface;

arranging a bonding material interposing and creating a hermetic seal between said active surface and said bonding surface and around at least one of a plurality of voids between said piezoelectric substrate and said encapsulant substrate, each of said plurality of voids having lateral dimensions at least equaling a footprint of a corresponding one of said plurality of electronic circuits, and forming a passivation layer over at least a portion of said encapsulant substrate and spanning said encapsulant substrate and said piezoelectric substrate.

20. The method as recited in claim 19 wherein at least one of said electronic circuits comprises a device selected from the group consisting of:

a surface acoustic wave device, a micro-electromechanical system device, a mirror device, a pyroelectric device, and a piezoelectric device.

21. The method as recited in claim 19 wherein said plurality of voids comprises a plurality of recesses located on said bonding surface.

22. The method as recited in claim 19 wherein said plurality of voids comprises a plurality of recesses located on said active surface.

23. The method as recited in claim 19 wherein said positioning further comprises positioning an encapsulant substrate comprising one selected from the group consisting of:

ceramic, silicon, and glass.

24. The method as recited in claim 19 wherein said providing further comprises providing a piezoelectric substrate comprising one selected from the group consisting of:

bismuth germanium oxide, gallium arsenide, lithium borate, lithium niobate, lithium tantalate, langasite, lead zirconium tantalate, and quartz.

25. The method as recited in claim 19 further comprising forming a plurality of vias containing metal, said metal contacting at least one of said plurality of electronic circuits to form terminals therefor.

26. The method as recited in claim 19 wherein said forming further comprises forming a plurality of electronic circuits, wherein each of said plurality of electronic circuits comprises SAW circuit conductors that cooperate to form multiple SAW resonators.

27. The method as recited in claim 19 wherein at least two of said plurality of electronic circuits are interconnected.

28. The method as recited in claim 19 wherein said arranging further comprises creating a hermetic seal around each of said plurality of electronic circuits.

29. The method as recited in claim 19 wherein said arranging further comprises creating a hermetic seal around at least two of said plurality of electronic circuits, said at least two of said plurality of electronic circuits being interconnected.

* * * * *